US006861754B2

(12) United States Patent
Lin et al.

(10) Patent No.: US 6,861,754 B2
(45) Date of Patent: Mar. 1, 2005

(54) SEMICONDUCTOR DEVICE WITH ANCHOR TYPE SEAL RING

(75) Inventors: Kang-Cheng Lin, Hsin-Chu (TW); Tien-I Bao, Hsin-Chu (TW)

(73) Assignee: Taiwan Semiconductor Manufacturing Company Ltd., Hsin-Chu (TW)

(*) Notice: Subject to any disclaimer, the term of this patent is extended or adjusted under 35 U.S.C. 154(b) by 0 days.

(21) Appl. No.: 10/628,040

(22) Filed: Jul. 25, 2003

(65) Prior Publication Data

US 2005/0017363 A1 Jan. 27, 2005

(51) Int. Cl.⁷ ............................................. H01L 23/48
(52) U.S. Cl. ....................... 257/758; 257/759; 257/760; 257/761
(58) Field of Search .................................. 257/756–762

(56) References Cited

U.S. PATENT DOCUMENTS 6,707,156 B2 * 3/2004 Suzuki et al. ............... 257/758
2004/0051177 A1 * 3/2004 Schoellkopf ................ 257/758

* cited by examiner

*Primary Examiner*—Long Pham
*Assistant Examiner*—Nathan W. Ha
(74) *Attorney, Agent, or Firm*—Slater & Matsil, L.L.

(57) ABSTRACT

A semiconductor package seal ring including a plurality of insulating layers, a plurality of conductive runners each embedded in one of the insulating layers, and a plurality of conductive posts each contacting one of the conductive runners and extending through at least one of the insulating layers and at least partially through an opening in another one of the conductive runners.

21 Claims, 5 Drawing Sheets

SEMICONDUCTOR DEVICE WITH ANCHOR TYPE SEAL RING

TECHNICAL FIELD

The present invention is directed, in general, to semiconductor device packaging and, more specifically, to a semiconductor package having decreased susceptibility to delaminating.

BACKGROUND

It is well known that semiconductor devices include an interconnect stricture having alternating layers of conductive interconnects and dielectric material. The conductive interconnects are employed to connect the active and passive devices formed in a semiconductor chip. After the semiconductor devices have been formed in or on a central or inner portion of the semiconductor chip, a seal ring or other anchor structure is typically formed in an outer region of one or more of the dielectric layers of the interconnect structure in an outer edge region of the chip around the active devices. Generally, the seal ring protects the semiconductor devices from contaminants and prevents the stacked layers of conductive interconnects and insulating dielectric layers from cracking or delaminating, such as by providing stress relief. The matrix of conductive interconnects and dielectric layers are especially susceptible to cracking and delaminating during the die sawing or other processes employed to separate the multiple chips formed on a wafer into individual chips or dies, and during the molding process employed to encapsulate individual dies in packaging material.

In a typical semiconductor device fabrication process, a large single crystal of silicon is sliced into wafers which are typically 6 inches to 12 inches in diameter. Using deposition and photolithographic techniques, alternating layers of conductive material and dielectric material are applied to the surface of the wafer to form logic devices and the interconnect structure, including the seal ring in an outer portion of the chip surrounding the logic devices formed in an inner portion of the chip. Generally, these layers are deposited at high temperatures and have very different thermal coefficients. Consequently, substantial stress is generated when the wafer undergoes the thermal cycling inherent to the processes employed to form the interconnect structure. After depositing a final passivation layer to protect the logic devices, the wafer is sawed or otherwise separated into individual dies. The dies are installed into a package. The package is typically made of either ceramic (for high power/high cost devices) or plastic (for low power/low cost devices).

As mentioned above, these fabrication processes create intrinsic stresses in the dielectric layers (e.g., silicon dioxide insulating layers employed to electrically isolate the conductive interconnects), the conductive interconnects, and the passivation layer. When the die is encapsulated, additional stresses are generated by the expansion differential between the die and the molding compound as the die cools to room temperature. Moreover, the adhesive bond between the molding compound and adjacent layers may delaminate, causing forces and stresses to concentrate on the surface of the die. If the stresses are high enough, it is possible for the passivation layer and/or the dielectric layers to crack. Once this has occurred, moisture can penetrate into the conductive interconnects which can cause corrosion and electrical shorting and lead to device failure.

Moreover, conventional seal rings include stacks of vertically aligned conductive vias substantially spanning the height of the seal ring. That is, each via extends between an upper surface of one of the conductive interconnects and a lower surface of another, overlying conductive interconnect. As such, the vias provide insufficient structural integrity, and do not provide adequate stress relief to compensate for the stress accumulation inherent to existing fabrication processes.

Accordingly, what is needed in the art is a seal ring that overcomes the problems discussed above.

SUMMARY OF THE INVENTION

To address the above-discussed deficiencies of the prior art, the present disclosure introduces a semiconductor package seal ring, and a semiconductor device including the seal ring, including a plurality of insulating layers and a plurality of conductive runners each embedded in one of the insulating layers. Each of the conductive runners includes an opening therein. The semiconductor package seal ring also includes a plurality of conductive posts each contacting one of the conductive runners and extending through at least one of the insulating layers and at least partially through the opening of another one of the conductive runners.

The present disclosure also provides a method of manufacturing a semiconductor package seal ring. The method includes forming a first insulating layer, forming first conductive runners in the first insulating layer, and forming a second insulating layer over the first insulating layer and the first conductive runners. A first conductive post contacting at least one of the first conductive runners and extending at least partially through the second insulating layer and between two of the first conductive runners is then formed. Second conductive runners are then formed in the second insulating layer, and a third insulating layer is formed over the second insulating layer and the second conductive runners. A second conductive post contacting at least one of the second conductive runners is then formed extending at least partially through the third insulating layer and between two of the second conductive runners.

The present disclosure also provides another embodiment of a semiconductor package, including a substrate, a plurality of insulating layers located over the substrate, and a plurality of conductive runners each located in one of the insulating layers over a periphery of the substrate, the conductive runners defining a plurality of columnar regions in the insulating layers that are unobstructed by the conductive runners. The semiconductor package also includes a plurality of conductive posts interconnecting the conductive runners, wherein each of the conductive posts is laterally offset from another vertically adjacent conductive post.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the present disclosure as a basis for designing or modifying other structures for carrying out the same purposes and/or achieving the same advantages of the present invention. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which:

FIGS. 2–6a illustrate sectional views of one embodiment of a method of manufacturing a semiconductor package seal ring according to aspects of the present disclosure;

FIG. 6b illustrates an alternate embodiment to FIG. 6a;

DETAILED DESCRIPTION OF ILLUSTRATIVE EMBODIMENTS

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct physical contact, and may also include embodiments in which additional features may be formed interposing the first and second features, such that the first and second features may not be in direct physical contact.

Figure 1:
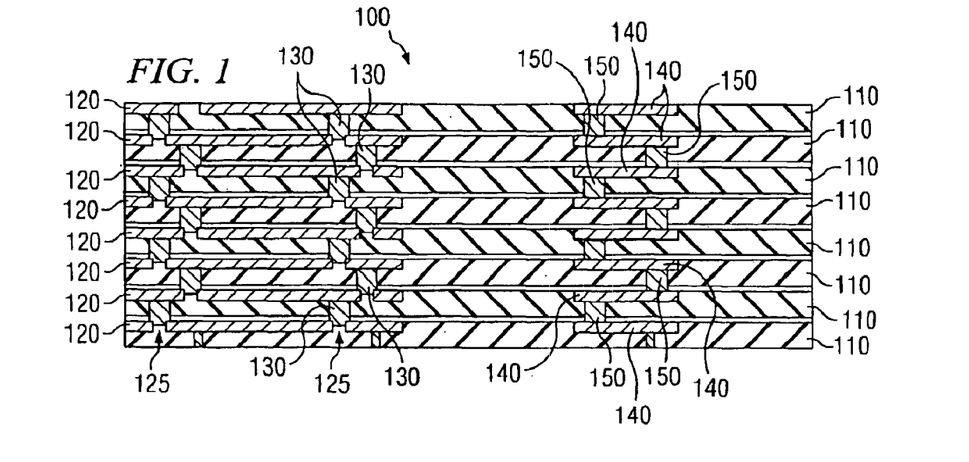
FIG. 1 illustrates a sectional view of one embodiment of a semiconductor package constructed according to aspects of the present disclosure.

Referring initially to FIG. 1, illustrated is a sectional view of one embodiment of a semiconductor package seal ring 100 constructed according to aspects of the present disclosure. The seal ring 100 includes or is formed in a plurality of insulating layers 110. The seal ring 100 also includes a plurality of conductive runners 120 each embedded in one of the insulating layers 110 and having at least one opening 125 therein. The seal ring 100 also includes a plurality of conductive posts 130 each contacting one of the conductive runners 120 and extending through at least one of the insulating layers 110 and at least partially through an opening 125 of another one of the conductive runners 120.

Each of the conductive posts 130 is laterally disposed from each of the other vertically adjacent conductive posts 130. That is, rather than being stacked on top of each other, each conductive post 130 is laterally offset from vertically neighboring conductive posts. By offsetting vertically adjacent conductive posts 130, the insulating layers 110 may be more securely anchored to one another, providing a more robust seal ring 100. As such, the seal ring 100 may render the insulating layers 110 of the seal ring 100 less susceptible to delaminating resulting from stress accumulation during subsequent processing.

The seal ring 100 may also be more robust in view of each of the conductive posts 130 extending from one of the conductive runners 120 to at least partially within the opening 125 in another conductive runner 120. That is, by extending the conductive posts 130 into the openings 125, the resulting structure anchoring the insulating layers 110 may provide more relief of the stress that accumulates during thermal cycling and die separation.

Moreover, the seal ring 100 may be implemented into existing semiconductor device fabrication procedures. For example, in the embodiment shown in FIG. 1, the conductive runners 120 may be formed at the same time as interconnects 140 typically formed to interconnect logic devices formed in the substrate underlying the insulating layers 110 (not shown). As such, the conductive runners 120 may be substantially similar in composition and fabrication to the interconnects 140. Similarly, the conductive posts 130 may be formed at the same time as vias 150 typically formed to selectively couple the interconnects 140. As such, the conductive posts 130 may be substantially similar in composition and fabrication to the vias 150.

Figure 2:
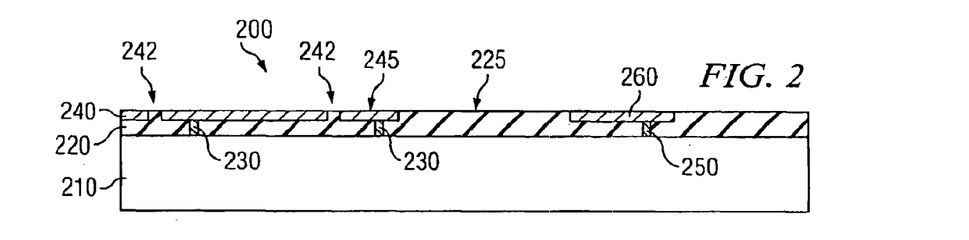

Referring to FIG. 2, illustrated is a sectional view of one embodiment of a semiconductor package seal ring 200 in an intermediate stage of manufacture according to aspects of the present disclosure. The semiconductor package seal ring 200 may be formed on a substrate 210 having conventional or future-developed microelectronic devices formed in or on a central portion of the substrate 210. Because only a portion of the semiconductor package 200 is shown in FIG. 2, the central portion and the microelectronic devices formed thereon are not shown in order to more clearly demonstrate the manufacture of the seal ring 200. However, those skilled in the art will understand that the scope of the present disclosure is not limited to embodiments incorporating any particular microelectronic devices or the processes employed in their manufacture. As such, the composition and manufacture of the substrate 210 may vary among applications. In one embodiment, the substrate 210 may be a silicon wafer having a thickness ranging between about 250 micrometers ($\mu$m) to 1,000 $\mu$m. In another embodiment, the substrate may be a silicon on insulator (SOI) substrate in which a thin silicon layer is formed over a buried oxide layer formed atop a thick supporting substrate.

An insulating layer 220 is formed over the substrate 210 and the microelectronic devices formed thereon. The insulating layer 220 may comprise plasma enhanced tetraethylorthosilicate (PETEOS), silicon dioxide or other oxides, and may have a thickness ranging between about 1,000 Angstroms and about 15,000 Angstroms. The insulating layer 220 may be formed by spin-on deposition, dry plasma etching, chemical-vapor-deposition, sputter deposition, thermal deposition, evaporation, physical vapor transport or other conventional or future-developed processes. In other embodiments, the insulating layer 220 may be formed of a low-k dielectric, which is generally considered to be a material with a dielectric constant less than the dielectric constant of silicon dioxide (about 3.9.). Examples include an oxide and methylsilsesquioxane ("MSQ") hybrid, an MSQ derivative, a porogen/MSQ hybrid, an oxide/hydrogen silsesquioxane ("HSQ," also known as Hydridosilsesquioxane) hybrid, an HSQ derivative, a porogen/HSQ hybrid, and the like. Other materials, such as nanoporous silica, xerogel, poly tetra fluoro ethylene ("PTFE"), and low-k dielectrics such as SiLK available from Dow Chemicals of Midland, Mich., Flare, available from AlliedSignal of Morristown, N.J., and Black Diamond, available from Applied Materials of Santa Clara, Calif. could also be employed for the insulating layer 220.

Vias 230 may then be formed in the insulating layer 220. The vias 230 may comprise aluminum, copper, doped silicon, tungsten (W) or other conductive materials, and may have a width ranging between about 400 Angstroms and about 10,000 Angstroms. In one embodiment, the vias 230 may be formed by forming openings in the insulating layer 220, such as by dry-plasma etching, and depositing conductive material in the openings, such as by chemical-vapor-deposition, sputter deposition, thermal deposition, evaporation, physical vapor transport or other conventional or future-developed processes. In one embodiment, one or more of the vias 230 may extend into the substrate 210 for interconnection with the microelectronic devices formed therein.

Conductive runners 240 may then be formed in or on the insulating layer 220. The conductive runners 240 may comprise aluminum, copper, doped silicon or other conductive materials, and may have a thickness ranging between about 800 Angstroms and about 12,000 Angstroms. The conductive runners 240 may include one or more openings 242. The openings 242 may be recesses or may extend through the conductive runners 242. In one embodiment, the conductive runners 240 may be formed by forming openings in the insulating layer 220, such as by dry-plasma etching, and depositing conductive material in the openings, such as by chemical-vapor-deposition, sputter deposition, thermal deposition, evaporation, physical vapor transport or other conventional or future-developed processes. The conductive runners 240 may also be planarized to form a substantially planar surface 245 substantially coincident with a surface 225 of the insulating layer, such as by a plasma etch-back process or chemical-mechanical polishing (CMP).

In one embodiment, one or more pairs of via 230 and conductive runner 240 may be a dual-damascene structure. For example, coincident via and trench openings may be formed and subsequently filled with conductive material. The manufacture of the vias 230 and conductive runners 240 may also include the formation of a barrier or adhesion layer (not shown) to prevent diffusion between the conductive runners 240 and the surrounding insulating layer 220 or to improve the adhesion of the vias 230 and conductive runners 240 to the insulating layer 220. Moreover, those skilled in the art will recognize that the vias 230 and conductive runners 240 may be formed during the same process steps employed to form vias 250 and interconnects 260 connecting the microelectronic devices formed in or on the substrate 210. As such, aspects of the present disclosure may be implemented with minimal impact to manufacturing time, costs and complexity.

Figure 3:
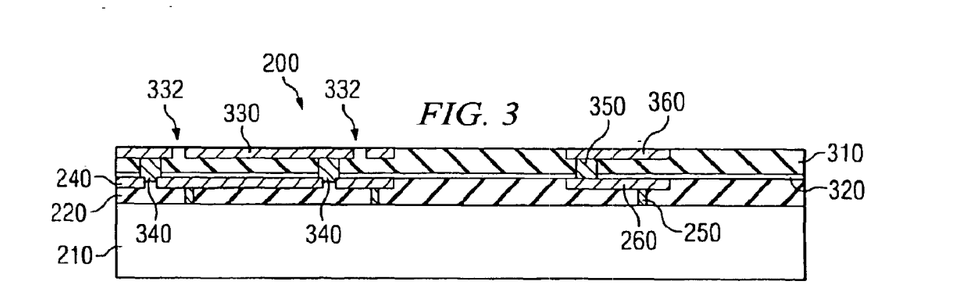

Referring to FIG. 3, illustrated is a sectional view of the seal ring 200 shown in FIG. 2 in a subsequent stage of manufacture, wherein a second insulating layer 310 is formed over the insulating layer 220 and conductive runners 240. The insulating layer 310 may be substantially similar in composition and manufacture to the insulating layer 220. In other embodiments, the insulating layer 310 (and subsequently described insulating layers) may be of different composition and manufacture in order to meet certain constraints such as mechanical stability, dielectric constant, and the like. Although not required for all applications, the particular embodiment shown in FIG. 3 includes a cap layer 320 that may include SiN, SiON, SiCOH or SiCONH or other insulating materials, as known in the art. The cap layer 320 may have a thickness ranging between about 100 Angstroms and about 1,500 Angstroms. The cap layer 320 may be formed by spin-on deposition, dry plasma etching, chemical-vapor deposition, sputter deposition, thermal deposition, evaporation, physical vapor transport or other conventional or future-developed processes.

As also shown in FIG. 3, a second layer of conductive runners 330 is formed in or on the insulating layer 310. The conductive runners 330 may be substantially similar in composition and manufacture to the conductive runners 240. As such, the conductive runners 330 may include one or more openings 332 that may be similar to the openings 242 in the conductive runners 240.

Conductive posts 340 may be formed concurrently with the conductive runners 330. For example, the conductive posts 340 and conductive runners 330 may form dual-damascene structures. Of course, the conductive posts 340 may also be formed by other processes, and may be discrete from the conductive runners 330. In general, the conductive posts 340 may be formed by processes similar to those which may be employed to form the vias 230, and may comprise aluminum, copper, tungsten, doped silicon or other materials. As in the embodiment shown in FIG. 1, the conductive posts 340 may extend at least partially into the openings 242 in the underlying conductive runner 240. Although not illustrated, in some embodiments, conductive posts 340 may extend fully into the opening 242 and in yet other embodiments, the posts could extend at least partly through openings 242 and extend into underlying insulating layer 220.

Moreover, as discussed above, those skilled in the art will recognize that the conductive posts 340 and conductive runners 330 may be formed during the same process steps employed to form vias 350 and interconnects 360 connecting the microelectronic devices formed in or on the substrate 210. Of course, the vias 350 may not extend into openings in the interconnects 360, although such an embodiment may be advantageous in some applications.

Figure 4:
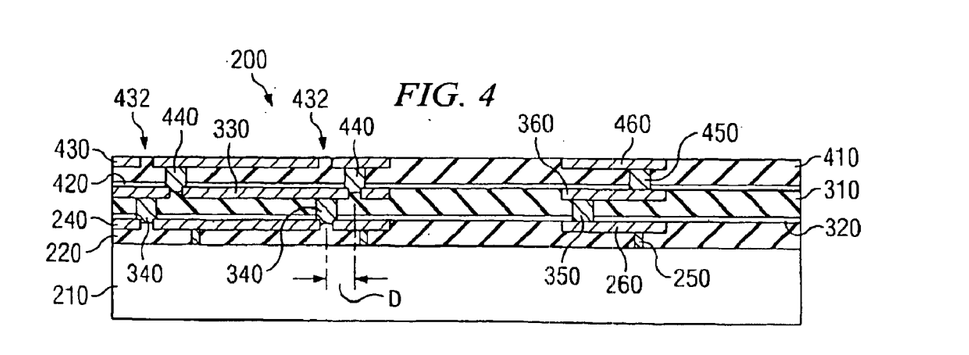

Referring to FIG. 4, illustrated is a sectional view of the seal ring 200 shown in FIG. 3 in a subsequent stage of manufacture, wherein a third insulating layer 410 is formed over the insulating layer 310 and conductive runners 330. The insulating layer 410 may be substantially similar in composition and manufacture to the previously formed insulating layers 220, 310. Although not required for all applications, the particular embodiment shown in FIG. 3 includes a cap layer 420 which may be substantially similar in composition and manufacture to the cap layer 320.

As also shown in FIG. 4, a third layer of conductive runners 430 is formed in or on the insulating layer 410. The conductive runners 430 may be substantially similar in composition and manufacture to the previously formed conductive runners 240, 330, and may include openings 432 similar to the openings 242, 332. Conductive posts 440 may be formed concurrently with the conductive runners 430. In general, the conductive posts 440 may be substantially similar in composition and manufacture to the conductive posts 340 introduced in FIG. 3. As with the conductive posts 340, the conductive posts 440 may extend at least partially into the openings 332 in the underlying conductive runners 330. Moreover, as with the embodiment shown in FIG. 1, the conductive posts 440 may be laterally offset from neighboring conductive posts 340, perhaps by an offset distance D between centerlines of the posts 340, 440. In one embodiment, the offset distance D may range between about 0 Angstroms and about 50,000 Angstroms, although another offset distance D may be employed within the scope of the present disclosure. Moreover, as discussed above, those skilled in the art will recognize that the conductive posts 440 and conductive runners 430 may be formed during the same process steps employed to form vias 450 and interconnects 460 connecting the microelectronic devices formed in or on the substrate 210.

Figure 5:
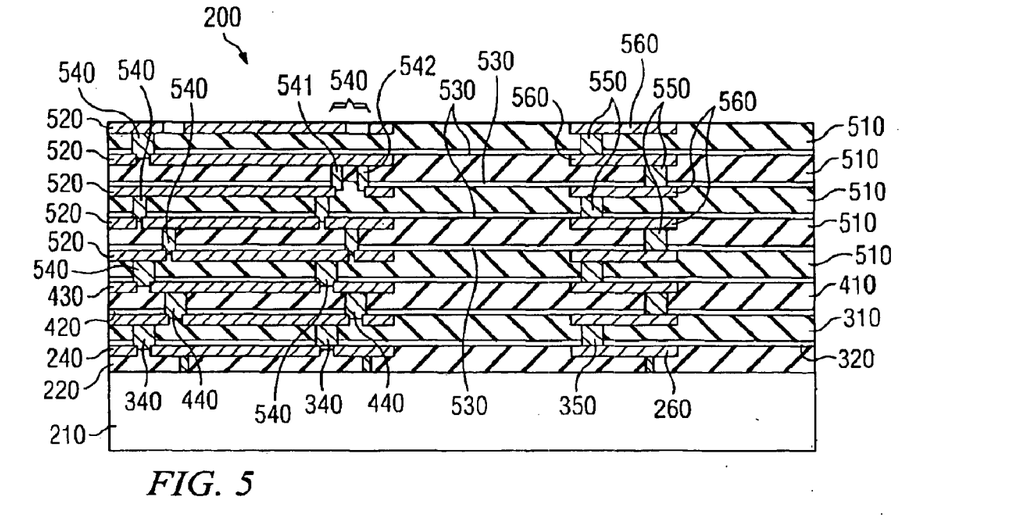

Referring to FIG. 5, illustrated is a sectional view of the seal ring 200 shown in FIG. 4 in a subsequent stage of manufacture, wherein the alternating series of insulating layers and conductive runners has been continued, perhaps to the extent necessary to complete the interconnect structure employed to interconnect the devices formed in or over a central portion of the substrate 210. As such, a plurality of insulating layers 510 may be alternatively formed with a corresponding layer of conductive runners 520. Cap layers 530 may also be formed between each pair of vertically adjacent insulating layers 510. In general, the insulating layers 510, conductive runners 520 and cap layers 530 may be similar in composition and manufacture to the insulating layer 220, conductive runners 240 and cap layer 320.

Conductive posts 540 may also be formed in one or more of the insulating layers 510 extending into one or more openings between underlying conductive runners 520. FIG. 5 also illustrates that one or more of the conductive posts 540 may each include several individual posts 541, 542, and that their layout may vary among layers and applications. This aspect also applies to other conductive posts within the seal ring 200, although not illustrated as such, including the conductive posts 340, 440. Moreover, the lateral disposition of the conductive posts 540 may be continued despite one or more of the posts 540 including multiple individual posts 541, 542, as shown in FIG. 5. The conductive posts 540 that include multiple individual posts 541, 542 may more reliably anchor the insulating layers 510 in which the posts 541, 542 are formed. However, in many applications the insulating layers 510 may be sufficiently anchored with individual posts, such as the conductive posts 340, 440. In general, the conductive posts 540 may be similar in composition and manufacture to the conductive posts 340, 440.

Moreover, as discussed above, those skilled in the art will recognize that the conductive posts 540 and conductive runners 520 may be formed during the same process steps employed to form vias 550 and interconnects 560 connecting the microelectronic devices formed in or on the substrate 210. Of course, the vias 550 may not extend into openings in the interconnects 560, although such an embodiment may be advantageous in some applications.

Figure 6A:
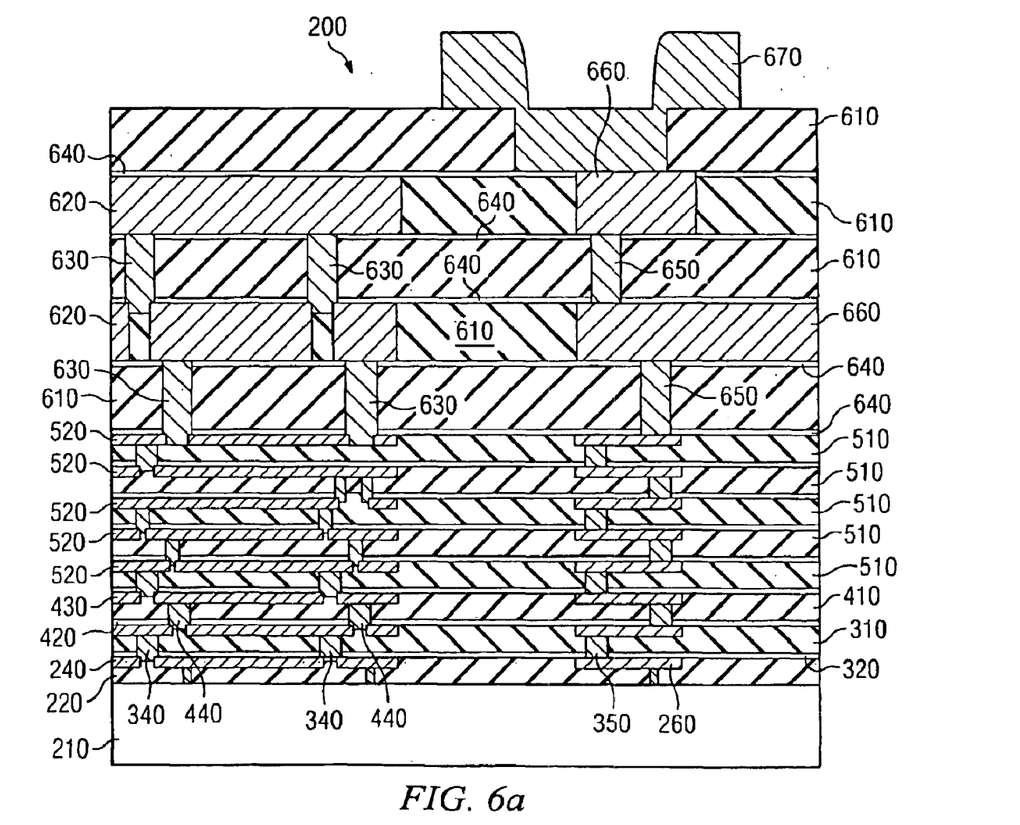

Referring to FIG. 6a, illustrated is a sectional view of the seal ring 200 shown in FIG. 5 in a subsequent stage of manufacture. In general, FIG. 6a illustrates the continuation of the alternating series of insulating layers 610 and conductive runners 620, although the thicknesses of these additional layers may vary from those previously formed. For example, the thickness of each of the insulating layers 610 may range between about 5,000 Angstroms and about 50,000 Angstroms. The thickness of the insulating layers 610 may be greater than the thickness of the previously formed insulating layers 220, 310, 410, 510. This is because in typical integrated circuit devices, the upper level metal layers have a higher current carrying requirement and are hence formed of a thicker metal, resulting in a thicker insulating layer in which the upper level metal layers are formed.

In order to minimize the need for special or additional processing steps, the conductive runners 240, 330, 430, 520, 620 of the sealing ring are preferably formed simultaneously with and in the same process steps as the metal layers of the logic devices in the center of the chip. Moreover, the alternating lateral position of conductive posts 630 may continue as with the previously formed posts 340, 440, 540. Cap layers 640 may also be formed between the conductive runners 620 and overlying insulating layers 610.

In general, the insulating layers 610, conductive runners 620 and cap layers 640 may be similar in composition and manufacture to the insulating layer 220, conductive runners 240 and cap layer 320. However, one or more of the insulating layers 610 may be a passivation layer, which may comprise silicon nitride or other materials, and may be formed by spin-on deposition, dry plasma etching, chemical-vapor-deposition, sputter deposition, thermal deposition, evaporation, physical vapor transport or other conventional or future-developed processes.

Moreover, as discussed above, those skilled in the art will recognize that the conductive posts 630 and conductive runners 620 may be formed during the same process steps employed to form vias 650 and interconnects 660 connecting the microelectronic devices formed in or on the substrate 210. Of course, the vias 650 may not extend into openings in the interconnects 660, although such an embodiment may be advantageous in some applications.

The device 200 may also include a bond pad 670 for subsequently mounting the device 200 to a lead frame, such as with bond wires or ultrasonic stud-bumps, as known in the art. The bond pad 670 may comprise copper, gold, aluminum or other conductive materials, and may be formed by blanket or selective deposition and subsequent patterning, such as by dry plasma etching.

Figure 6B:
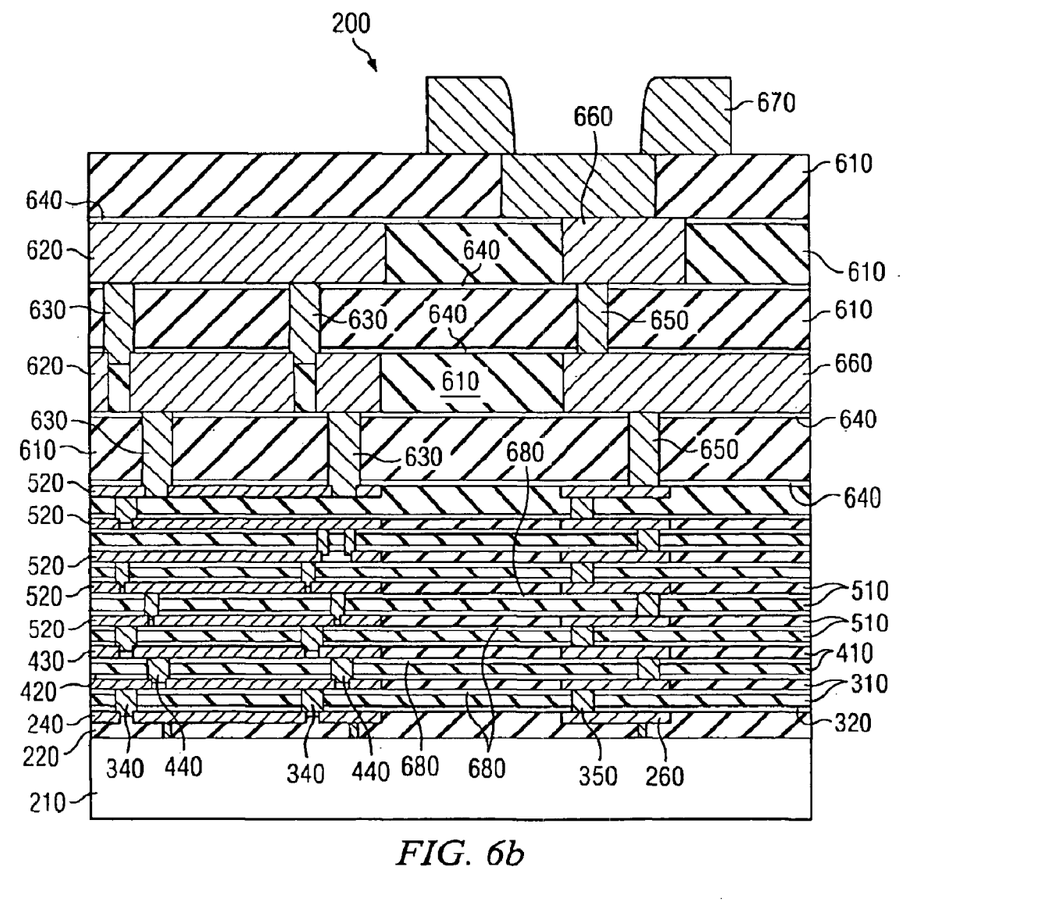

Referring to FIG. 6b, illustrated is a sectional view of an alternative embodiment of the seal ring 200 shown in FIG. 6a. In this embodiment, multiple layers of etch stop layer 680 are interposed within insulating layers 310, 410 and 510. Etch stop layer 680 may include SiN, SiON, SiCOH or SiCONH or other insulating materials, as known in the art. Etch stop layer 680 may have a thickness ranging between about 100 Angstroms and about 1,500 Angstroms. Etch stop layer 680 may be formed by spin-on deposition, dry plasma etching, chemical-vapor-deposition, sputter deposition, thermal deposition, evaporation, physical vapor transport or other conventional or future-developed processes. Etch stop layer 680 may be used, for example, when the conductive posts 340 and vias 350 and their respective overlying conductors are dual-damascene structures.

Figure 7:
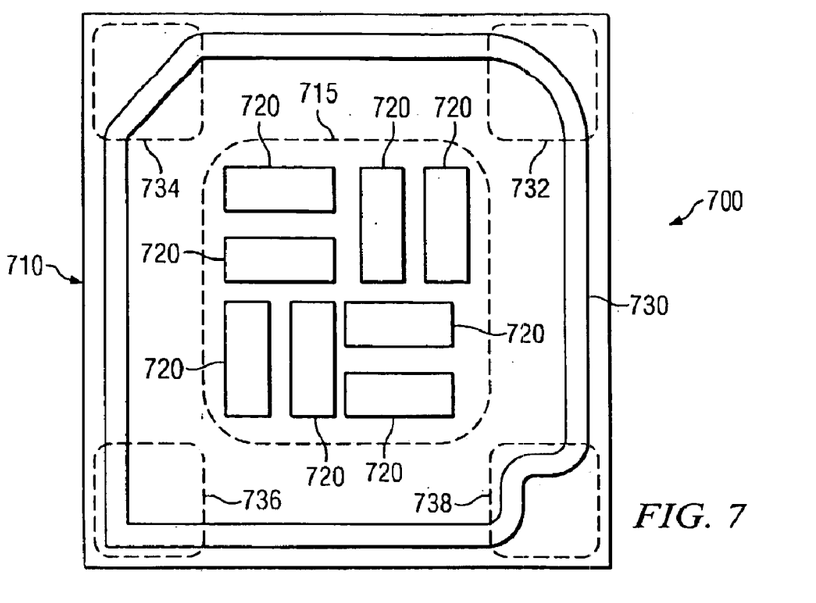
FIG. 7 illustrates a plan view of one embodiment of a semiconductor package constructed according to aspects of the present disclosure.

Referring to FIG. 7, illustrated is a plan view of one embodiment of a semiconductor package 700 constructed according to aspects of the present disclosure. The semiconductor package 700 may be one environment in which the semiconductor package seal ring 100 shown in FIG. 1 or seal ring 200 shown in FIG. 6a is implemented. The semiconductor package 700 includes a substrate 710 having microelectronic devices 720 formed in or on a central portion 715 of the substrate 710. The microelectronic devices 720 may include complementary metal-oxide-semiconductor (CMOS) transistors, microelectromechanical system (MEMS) devices, surface acoustic wave (SAW) devices, optoelectronic devices and other active devices, as well as passive devices, such as resistive and capacitive elements, although the present disclosure does not limit the particular type or nature of the devices 720. The semiconductor package 700 also includes a seal ring 730 located on a perimeter of the substrate 710. While the advantages described in the present disclosure may be achieved with a seal ring 730 of any profile that substantially surrounds the active devices 720, several exemplary profiles are illustrated in the corners of the substrate 710.

For example, a section 732 of the seal ring 730 may be rounded, perhaps to a radius ranging between about 50 micrometers and about 200 micrometers. The seal ring 730 may also have a series of 45° corners, as in the section 734. The seal ring 730 may also have a 90° or right-angle corner, as in the section 736. The seal ring 730 may also have a series of 90° bends, as in the section 738. Accordingly, the seal ring 730 is not limited by the present disclosure to any particular profile.

Figure 8:
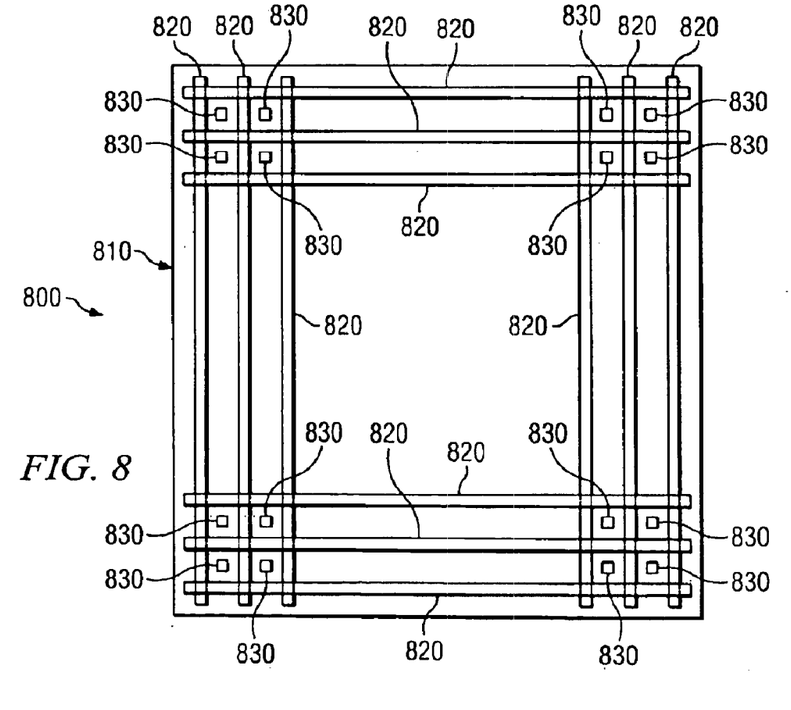
FIG. 8 illustrates a plan view of one embodiment of a semiconductor package constructed according to aspects of the present disclosure.

Referring to FIG. 8, illustrated is a plan view of an embodiment of a semiconductor package 800 constructed according to aspects of the present disclosure. In general, the semiconductor package 800 may be similar to the device 700 shown in FIG. 7. However, instead of or in addition to a seal ring, such as the seal ring 100 shown in FIG. 1, aspects of the present disclosure may be applied to an interconnect structure which may advantageously anchor insulating layers, which may thereby protect against the formation of a metal oxide at the interfaces between conductive runners and adjacent insulating layers, and which may also provide improved stress relief, without having a significant impact on manufacture processes, time and costs.

The package 800 includes a plurality of insulating layers 810 and conductive runner layers 820, which may be similar in composition and manufacture to the insulating layers 220 and conductive runners 240 introduced in FIG. 2, respectively. Moreover, the package 800 also includes a series of conductive posts 830, which may be similar in composition and manufacture to the conductive posts 340, 440, 540, 630 shown in previous Figures. However, as in the embodiment illustrated in FIG. 8, the conductive posts 830 may be located within columnar regions of the insulating layers 810 that are unobstructed by the conductive runners 820, as described below.

Moreover, each of the insulating layers 810 may include multiple conductive posts 830 that are each laterally disposed from conductive posts 830 located in vertically adjacent insulating layers 810. For example, FIG. 9 illustrates a section view of one corner or quadrant of the package 800 shown in FIG. 8, wherein each odd-numbered insulating layer 810a includes two adjacent conductive posts 830a in a first columnar region 815 of the insulating layers 810, and each even-numbered insulating layer 810b includes two adjacent conductive posts 830b in a second columnar region 817 of the insulating layers 810.

Figure 10:
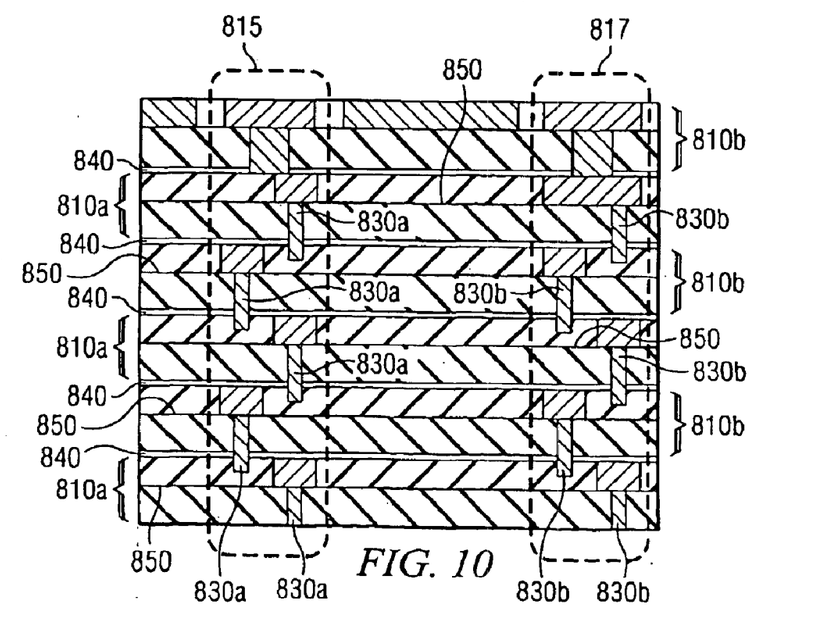
FIG. 10 illustrates a sectional view of another embodiment of the semiconductor package shown in FIG. 8.

As another example, FIG. 10 illustrates a sectional view of one corner or quadrant of the package 800 shown in FIG. 8 wherein each insulating layer 810 includes a conductive post 830a in the first columnar region 815 and a conductive post 830b in the second columnar region 817. However, improved stress relief and contaminant protection may be achieved if each of the conductive posts 830a (or 830b) within the first columnar region 815 (or second columnar region 817) are laterally disposed from those in vertically adjacent insulating layers 810, as shown in FIG. 10.

Figure 9:
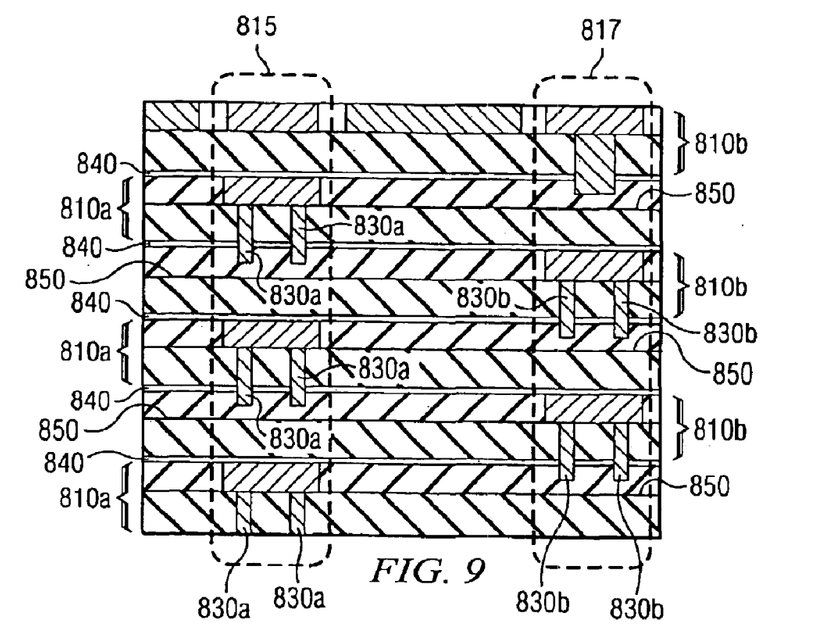
FIG. 9 illustrates a sectional view of one embodiment of the semiconductor package shown in FIG. 8.

Moreover, with the embodiments shown in FIGS. 9 and 10 and with other arrangements within the scope of the present disclosure, additional stress relief and contaminant protection may be achieved if the conductive posts 830 formed in each insulating layer 810 extend at least partially into the underlying insulating layer 810. Furthermore, as shown in FIGS. 9 and 10, one or more of the conductive posts 830 may be in a dual-damascene structure.

The semiconductor package 800 may also include a plurality of cap layers 840 each interposing a pair of the insulating layers 810. The cap layers 840 may comprise SiN, SiON, SiCOH or SiCONH, and may be formed by spin-on deposition, dry plasma etching, chemical-vapor-deposition, sputter deposition, thermal deposition, evaporation, physical vapor transport or other conventional or future-developed processes. The semiconductor package 800 may also include etch stop layers 850 located within the insulating layers 810, such as in embodiments in which the conductive posts 830a, 830b are in dual-damascene structures. These dual-damascene structures, as well as the other dual-damascene structures described herein, may be formed with two single-damascene processes, or with a single dual-damascene process.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package seal ring, comprising:
   a plurality of insulating layers;
   a plurality of conductive runners each embedded in one of the insulating layers, wherein each of the conductive runners includes an opening therein; and
   a plurality of conductive posts each contacting one of the conductive runners and extending through at least one of the insulating layers and at least partially through the opening of another one of the conductive runners.

2. The semiconductor package seal ring recited in claim 1 wherein each of the conductive posts is laterally disposed from other vertically adjacent conductive posts.

3. The semiconductor package seal ring recited in claim 2 wherein a first half of the conductive posts are vertically aligned in a first column and a second half of the conductive posts are vertically aligned in a second column.

4. The semiconductor package seal ring recited in claim 1 wherein the conductive runners comprise one selected from the group consisting of:
   aluminum;
   copper; and
   doped silicon.

5. The semiconductor package seal ring recited in claim 1 wherein the conductive posts comprise one selected from the group consisting of:
   aluminum;
   copper;
   tungsten; and
   doped silicon.

6. The semiconductor package seal ring recited in claim 1 further comprising a plurality of films each interposing above one of the insulating layers and below one of the conductive runners.

7. The semiconductor package seal ring recited in claim 6 wherein each of the films directly contacts an adjacent one of the insulating layers and an adjacent one of the conductive runners.

8. The semiconductor package seal ring recited in claim 6 wherein the films are cap layers.

9. The semiconductor package seal ring recited in claim 6 wherein the films comprise SiN.

10. The semiconductor package seal ring recited in claim 1 wherein at least one of the conductive posts is in a dual-damascene structure.

11. The semiconductor package seal ring recited in claim 1 further comprising a plurality of etch stop layers each interposing below one of the insulating layers and above one of the conductive runners.

12. A semiconductor device, comprising:
   active devices located in a central portion of a substrate; and
   a seal ring located at the periphery of the substrate, the seal ring including
      a plurality of insulating layers;
      a plurality of conductive runners each embedded in one of the insulating layers, wherein each of the conductive runners includes an opening therein; and
      a plurality of conductive posts each contacting one of the conductive runners and extending through at least one of the insulating layers and at least partially through the opening of another one of the conductive runners.

13. The semiconductor device recited in claim 12 wherein each of the conductive posts is laterally disposed from other vertically adjacent conductive posts.

14. The semiconductor device recited in claim 13 wherein a first half of the conductive posts are vertically aligned in a first column and a second half of the conductive posts are vertically aligned in a second column.

15. The semiconductor device recited in claim 12 wherein the conductive runners comprise aluminum.

16. The semiconductor device recited in claim 12 wherein the conductive posts comprise tungsten.

17. The semiconductor device recited in claim 12 wherein the seal ring further includes a plurality of cap layers each interposing above one of the insulating layers and below one of the conductive runners.

18. The semiconductor device recited in claim 12 wherein at least one of the conductive posts is in a dual-damascene structure.

19. The semiconductor device recited in claim 12 wherein the seal ring further includes a plurality of etch stop layers each interposing below one of the insulating layers and above one of the conductive runners.

20. A semiconductor package, comprising:
   a substrate;
   a plurality of insulating layers located over the substrate;
   a plurality of conductive runners each located in one of the insulating layers over a periphery of the substrate, the conductive runners defining a plurality of columnar regions in the insulating layers that are unobstructed by the conductive runners; and
   a plurality of conductive posts interconnecting the conductive runners, wherein each of the conductive posts is laterally offset from another vertically adjacent conductive post.

21. The semiconductor package recited in claim 20 wherein the columnar regions include first and second columnar regions, wherein each of odd-numbered ones of the insulating layers includes a first one of the conductive posts located in the first columnar regions and not in the second columnar regions, and wherein each of even-numbered ones of the insulating layers includes a second one of the conductive posts located in the second columnar regions and not in the first columnar regions.

* * * * *